(12) United States Patent
He et al.

(10) Patent No.: US 11,913,854 B2
(45) Date of Patent: Feb. 27, 2024

(54) METHOD AND SYSTEM FOR FAULT DIAGNOSIS WITH SMALL SAMPLES OF POWER EQUIPMENT BASED ON VIRTUAL AND REAL TWIN SPACES

(71) Applicant: WUHAN UNIVERSITY, Hubei (CN)

(72) Inventors: Yigang He, Hubei (CN); Jiajun Duan, Hubei (CN); Xiaoxin Wu, Hubei (CN); Liulu He, Hubei (CN); Hui Zhang, Hubei (CN); Guolong Shi, Hubei (CN)

(73) Assignee: WUHAN UNIVERSITY, Hubei (CN)

( * ) Notice: Subject to any disclaimer, the term of this patent is extended or adjusted under 35 U.S.C. 154(b) by 611 days.

(21) Appl. No.: 17/124,499

(22) Filed: Dec. 17, 2020

(65) Prior Publication Data
US 2021/0319156 A1 Oct. 14, 2021

(30) Foreign Application Priority Data
Apr. 9, 2020 (CN) .......................... 202010273965.3

(51) Int. Cl.
| | |
|---|---|
| *G01M 15/02* | (2006.01) |
| *G06F 30/27* | (2020.01) |
| *G01M 15/05* | (2006.01) |
| *G01M 15/11* | (2006.01) |
| *G06N 3/08* | (2023.01) |
| *G06F 18/213* | (2023.01) |
| *G06F 18/214* | (2023.01) |

(52) U.S. Cl.
CPC ............ *G01M 15/02* (2013.01); *G01M 15/05* (2013.01); *G01M 15/11* (2013.01); *G06F 18/213* (2023.01); *G06F 18/214* (2023.01); *G06F 30/27* (2020.01); *G06N 3/08* (2013.01)

(58) Field of Classification Search
CPC ... G01R 19/2513; G01R 31/62; G01M 15/02; G01M 15/05; G01M 15/11; G06F 18/213; G06F 18/214; G06F 30/27; G06F 18/217; G06N 3/08
See application file for complete search history.

(56) References Cited

U.S. PATENT DOCUMENTS

| | | | | |
|---|---|---|---|---|
| 9,881,430 B1* | 1/2018 | Shah | ..................... | G07C 5/0808 |
| 2016/0188675 A1* | 6/2016 | Vossler | ................... | H04L 67/12 |
| | | | | 707/776 |
| 2018/0054376 A1* | 2/2018 | Hershey | ................ | H04L 43/067 |
| 2018/0130260 A1* | 5/2018 | Schmirler | ............... | G06F 3/011 |
| 2019/0302712 A1* | 10/2019 | Neti | .................... | G05B 23/0254 |

(Continued)

*Primary Examiner* — Mohammad K Islam
(74) *Attorney, Agent, or Firm* — JCIPRNET

(57) ABSTRACT

A method and a system for fault diagnosis with small samples of power equipment based on virtual and real twin spaces are disclosed, which belong to the field of fault diagnosis of power equipment. The method includes: test samples containing different locations, types and severity levels of fault of power equipment are acquired to form a real physical space; a virtual mirror space is acquired by simulation according to a simulation model of the equipment to be diagnosed; the training set in the real physical space is spatially integrated with the sample set in the virtual mirror space to obtain a training sample set in the twin spaces; the training sample set in the twin spaces serves as the supplement to the training set in the real physical space, and the fault type and fault location serve as diagnostic labels to be input to the deep neural network for training.

20 Claims, 4 Drawing Sheets

(56) References Cited

U.S. PATENT DOCUMENTS

2019/0304673 A1* 10/2019 Neti ..................... H01F 27/42
2020/0067969 A1* 2/2020 Abbaszadeh .......... G06N 20/10
2020/0265535 A1* 8/2020 Okada ................... G06N 3/084

* cited by examiner

METHOD AND SYSTEM FOR FAULT DIAGNOSIS WITH SMALL SAMPLES OF POWER EQUIPMENT BASED ON VIRTUAL AND REAL TWIN SPACES

CROSS-REFERENCE TO RELATED APPLICATION

This application claims the priority benefit of China application serial no. 202010273965.3, filed on Apr. 9, 2020. The entirety of the above-mentioned patent application is hereby incorporated by reference herein and made a part of this specification.

BACKGROUND

Technical Field

The disclosure belongs to the field of fault diagnosis of power equipment, and more specifically, relates to a method and system for fault diagnosis with small samples of power equipment based on virtual and real twin spaces.

Description of Related Art

As modern equipment is developed with high precision, intelligence, and high integration, manufacturers have set higher requirement for reliability and operational safety for equipment. However, currently the capability in smart diagnosis for fault of power equipment is low, and the lack of fault samples of power equipment further limits the development of smart diagnosis for equipment. Moreover, in view of the economic concern or safety concern, conducting fault and destructive tests on transformers to obtain fault samples required for research in diagnostic cannot be achieved on a large scale. By using digital twin technology, it is possible to use data from real world to establish a cyberspace model of a virtual world, thereby completing the mapping between the real world and the virtual space. By exploring how to integrate the actual power transformer with the simulation model, it is possible to facilitate overcoming the shortage of fault samples of equipment and expedite development, so as to further explore the smart fault diagnosis method for equipment.

Considering that power equipment has the following characteristics: high reliability, defects or failures of power equipment are events with small probability, and there is a scarcity of data for reflecting abnormality of equipment, while simulated data is easy to obtain and less error-prone as compared with actually measured data, it is an urgent technical issue to find out how to integrate the simulated data and actually measured data obtained from the mechanism model of transformer to explore the smart fault diagnosis method formulated by the combination of data-driven deep learning and model-driven power equipment model.

SUMMARY

Technical Problem

In view of the above defects or requirements for improvement of related art, the disclosure provides a method and system for fault diagnosis with small samples of power equipment based on virtual and real twin spaces, thereby achieving the purpose of improving smart level and diagnosis accuracy rate of fault diagnosis method for power equipment, and such method may be applied to conditions where safe reliability is high, fault frequency is low and deterioration features are not in consistency.

To achieve the above purpose, according to an aspect of the disclosure, a method for fault diagnosis with small samples of power equipment based on virtual and real twin spaces is provided, and the method includes:
(1) Test samples containing different locations, types and severity levels of fault of power equipment are acquired to form a real physical space.
(2) A simulation model of the equipment to be diagnosed is established, and the corresponding fault type is configured, random noise is superimposed on the parameters of the simulation model to acquire the required number of samples by simulation to form a virtual mirror space.
(3) The samples in the real physical space are divided into a training set and a verification set.
(4) The training set in the real physical space is integrated with the sample set in the virtual mirror space to obtain a training sample set in the virtual and real twin spaces.
(5) The training sample set in the virtual and real twin spaces is used as the supplement to the training set in the real physical space, and the fault type and fault location are used as diagnostic labels to be input to the deep neural network for training. The trained deep neural network is utilized to perform identification and positioning of fault on the verification set in the real physical space to verify the diagnosis result.

Preferably, step (1) includes:
The areas are divided according to the diagnosis requirements and fault characteristics of the equipment to be diagnosed, and the divided areas are used as different fault locations of the power equipment. Moreover, the types and severity levels of fault are determined according to the regularity of statistical data of fault of the equipment to be diagnosed. Then, test samples containing different locations, types and severity levels of fault of power equipment are obtained to form a real physical space.

Preferably, step (2) includes:
In the simulation model of the equipment to be diagnosed, the simulated fault type and fault location are configured according to the actual fault type and fault location divided in step (1), and the severity level in simulation is randomly set according to the distribution of the actual fault level. Then a loop simulation is performed to involve different fault areas, fault types and fault levels, so as to obtain simulated fault samples of equipment, and the virtual mirror space is formed through the fault samples obtained from all simulations.

Preferably, step (4) includes:
The power equipment status label corresponding to the data is set as $\gamma$, and the sample with label $\gamma$ in the real physical space is marked as $SR_\gamma = \{SR_{\gamma 1}; SR_{\gamma 2}; SR_{\gamma 3}; \ldots\}$, which is called a subset of the real physical space. The subset of the real physical space contains a total of $NR_\gamma$ samples, and $NR_\gamma$ represents the data amount of the samples with the label $\gamma$ in the real physical space.

The samples with label $\gamma$ in the virtual mirror space are denoted as $SV_\gamma = \{SV_{\gamma 1}; SV_{\gamma 2}; SV_{\gamma 3}; \ldots\}$, which is called a subset of the virtual mirror space, and the subset of the virtual mirror space contains $NV_\gamma$ samples in total, and $NV_\gamma$ represents the number of samples with label $\gamma$ in the virtual mirror space.

The fault feature extraction is performed on all samples in the subset in the real physical space and the subset in the virtual mirror space, and the original sample data is replaced with the sample data after feature extraction.

A sample data of the first equipment to be diagnosed with the label γ is taken from the subset in the real physical space, and a sample data of the second equipment to be diagnosed with the label γ is taken from the subset in the virtual mirror space. The sample data of the first equipment to be diagnosed and the sample data of the second equipment to be diagnosed are integrated, so as to complete the integration of various samples in the subset in the real physical space and various samples in the subset in the virtual mirror space to obtain a training sample set in the virtual and real twin spaces.

Preferably, sample integration is performed by $\varphi(R, V)=R \otimes V$, where $\varphi(R, V)$ represents an integration function, R represents a sample in a subset in the real physical space, and V represents the sample in the subset in the virtual mirror space.

Preferably, the method of using a deep neural network for fault diagnosis in step (5) is:

The total number of last outputs with a parameter layer in the deep neural network is replaced with n×m+1, so as to perform network training to classify and identify fault labels, and realize identification and positioning of fault type, wherein n is the fault type and m is the fault location.

Preferably, the method further includes:

The new data to be diagnosed is added into the training set in the real physical space, return to step S4, and the network is updated continuously.

Preferably, when the amount of new data to be diagnosed is greater than the amount of preset sample data, and the training from scratch takes longer than the preset time, feature extraction is performed on the new data to be diagnosed, and the new sample data after feature extraction is utilized to perform migration learning on the originally trained network, thereby updating the network. Alternatively, the new data to be diagnosed is merged into the original training set in the real physical space to reacquire the training sample set in the virtual and real twin spaces, and the new training sample set in the virtual and real twin spaces is utilized for retraining.

When the amount of new data to be diagnosed is less than the amount of preset sample data, or the training from scratch takes shorter than the preset time, the new data to be diagnosed is merged into the original training set in the real physical space, thereby reacquiring the training sample set in the virtual and real twin spaces, and the new training sample set in the virtual and real twin spaces is utilized for retraining.

According to another aspect of the disclosure, a system for fault diagnosis with small samples of power equipment based on virtual and real twin spaces is provided, and the system includes:

An actual data acquisition module is configured to acquire test samples containing different locations, types and severity levels of fault of power equipment to form a real physical space.

A simulation data acquisition module is configured to establish a simulation model of the equipment to be diagnosed, and the corresponding fault type is configured, random noise is superimposed on the parameters of the simulation model to obtain the required number of samples by simulation to form a virtual mirror space.

A sample set dividing module is configured to divide the samples in the real physical space into a training set and a verification set.

An integrating module is configured to integrate the training set in the real physical space with the sample set in the virtual mirror space to obtain a training sample set in the virtual and real twin spaces.

A diagnosis module is configured to utilize the training sample set in the virtual and real twin spaces as the supplement to the training set in the real physical space, and the fault type and fault location are used as diagnostic labels to be input to the deep neural network for training. The trained deep neural network is utilized to perform identification and positioning of fault on the verification set in the real physical space to verify the diagnosis result.

According to another aspect of the disclosure, a computer-readable storage medium having program instructions stored therein is provided. When the program instructions are executed by a processor, any one of the methods for fault diagnosis with small samples of power equipment based on virtual and real twin spaces is realized.

In general, compared with the related art, the above technical solutions conceived by the disclosure can achieve the following advantageous effects:

By integrating the simulated data acquired from the mechanism model of the power equipment with the actually measured data, it is possible to explore the smart fault diagnosis method formulated by the combination of data-driven deep learning and model-driven power equipment model, and to enhance diagnosis result with only a few amount of test data or for power equipment with high reliability from which experiment data is relatively difficult to acquire.

DESCRIPTION OF THE EMBODIMENTS

In order to make the purpose, technical solutions, and advantages of the disclosure clearer, the disclosure is further described in detail below with reference to the accompanying drawings and embodiments. It should be understood that the specific embodiments described here are only used to explain the disclosure, but not to limit the disclosure. In addition, the technical features involved in the various embodiments of the disclosure described below can be combined with each other as long as they do not conflict with each other.

The disclosure is not only suitable for fault diagnosis of frequency scanning response analysis of transformer winding, but also can be applied to other fields related to diagnosis.

In the disclosure, by integrating the simulated data acquired from the mechanism model of the power equipment with the actually measured data, it is possible to explore the smart fault diagnosis method formulated by the combination of data-driven deep learning and model-driven power equipment model, and to enhance diagnosis result with only a few amount of test data or for power equipment with high reliability from which experiment data is relatively difficult to acquire.

Figure 1:
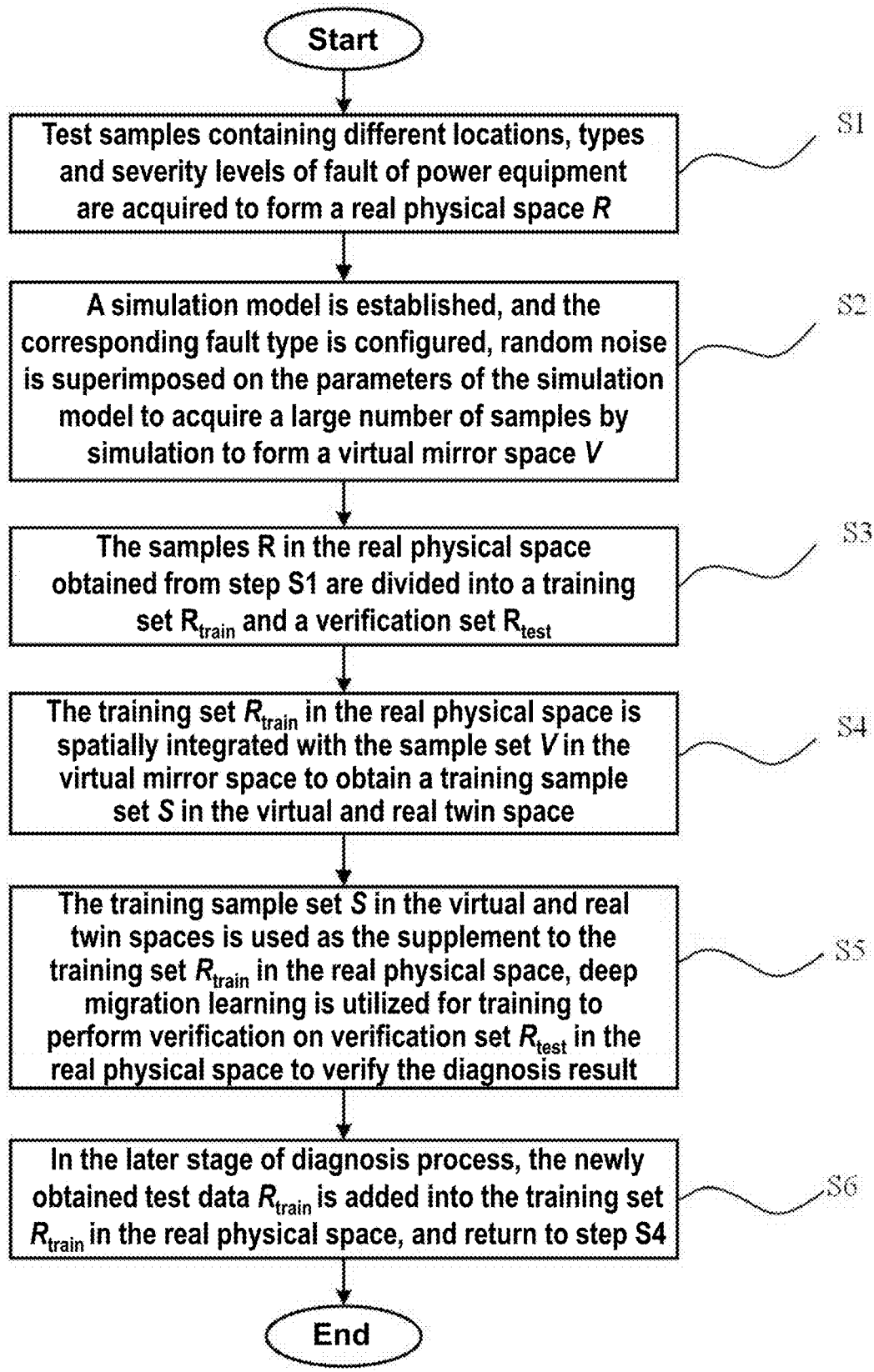
FIG. 1 is a schematic flowchart of a method for fault diagnosis with small samples of power equipment based on virtual and real twin spaces according to an embodiment of the present disclosure.

As shown in FIG. 1, take the fault diagnosis for power transformer windings as an example, in the embodiment of the disclosure, the method for fault diagnosis with small samples of power equipment based on virtual and real twin spaces includes the following steps:

S1: Test samples containing different locations, types and severity levels of fault of power equipment are acquired to form a real physical space R.

S2: A simulation model of the equipment to be diagnosed is established, and the corresponding fault type is configured, random noise is superimposed on the parameters of the simulation model to acquire a large number of samples by simulation to form a virtual mirror space V.

S3: The samples R in the real physical space obtained from step S1 are divided into a training set $R_{train}$ and a verification set $R_{test}$.

S4: The training set $R_{train}$ in the real physical space obtained from step S3 is spatially integrated with the sample set V in the virtual mirror space obtained from step S2 to obtain a training sample set S in the virtual and real twin spaces.

S5: The training sample set S in the virtual and real twin spaces is used as the supplement to the training set $R_{train}$ in the real physical space, and the fault type and fault location are used as diagnostic labels to be input to the deep neural network for training. Identification and positioning of fault are performed on the verification set $R_{test}$ in the real physical space to verify the diagnosis result.

S6: In the later stage of diagnosis process, the newly obtained data is added into the training set $R_{train}$ in the real physical space, return to step S4, and the network is updated continuously.

Further, when dividing the different fault locations of the power equipment in step S1, the area should be divided according to the diagnosis requirements and fault characteristics of the equipment to be diagnosed, and the types and severity levels of the fault need to be determined according to the regularity of the statistical data of fault of the equipment to be diagnosed. Samples for the same fault label are acquired as many as possible, and all samples constitute a real physical space R. Specifically, when the disclosure is adopted for diagnosis, the diagnosis will be effective when the number of each label is 2 or more.

Further, the simulation model of the equipment to be diagnosed established in step S2 should be set according to the actual fault type and fault location divided in step S1, and the severity level in simulation should be randomly set according to the distribution of the actual fault level. For example, on basis of normal state value, the loop is set, and the electrical parameters of the model is selected according to the test content, such as grounding capacitance $C_g$, capacitance $C_s$, self-inductance $L_s$, mutual inductance $M_{i(i+1)}$, resistance R, etc., to set the above parameters as random multiples of the normal values. Then a loop simulation is performed. The loop step size and abnormal parameters are selected according to the quantity requirements of the data set and the fault type to be detected. Different fault areas, fault types and fault levels can be involved to obtain the simulated equipment fault samples, and all samples constitute the virtual mirror space V.

Further, in the process of establishing the diagnosis method in step S3, the samples in the real physical space R are divided into two parts: the training set $R_{train}$ and the verification set $R_{test}$. After the diagnosis method is established, there is no need to divide the new data to be diagnosed into the training set and the verification set, and all the data to be diagnosed are directly added to the training set $R_{train}$.

Further, in step S4, the training set $R_{train}$ in the real physical space R is integrated with the sample set in the virtual mirror space V, and the method for obtaining the virtual and real twin spaces S includes the following steps:

1) The R-space represents the real physical space R, and the V-space represents the virtual mirror space V.

2) It is assumed that the power equipment status label corresponding to the data is γ, the sample with the label γ in the R-space is marked as $SR_γ=\{SR_{γ1}; SR_{γ2}; SR_{γ3}; ...\}$, which is referred to as a subset (sample cluster) of R-space. The subset (sample cluster) contains a total of $NR_γ$ samples. $NR_γ$ represents the amount of data of the samples with label γ in R. Similarly, the sample cluster with the label γ in V-space is denoted as $SV_γ=\{SV_{γ1}; SV_{γ2}; SV_{γ3}; ...\}$, which is referred to as a subset of the virtual mirror space, the subset of the virtual mirror space contains $NV_γ$ samples in total, and $NV_γ$ represents that the number of samples with the label γ in the virtual mirror space is $NV_γ$.

3) The fault feature extraction is performed on all samples in the subset of the real physical space and the subset of the virtual mirror space. The differentiating features of samples belonging to various labels γ are acquired as many as possible, and the original sample data is replaced with the sample data after feature extraction.

4) The sample data of the equipment to be diagnosed with the label γ is taken from the V-space and the R-space respectively, such as $SR_{γ1}$ and $SV_{γ2}$, and integration calculation is performed on the above sample data. The symbol "⊗" represents the sample integration calculation. The calculation process is expressed by integration function φ(R, V), including: φ(R, V)=R⊗V.

Further, the feature extraction method when acquiring the virtual and real twin spaces S in step S4 includes a variety of parameter indicators, such as Root Mean Square Error (RMSE), Mean Square Error (MSE), Mean Absolute Error (MAE), Mean Absolute Percentage Error (MAPE), Symmetric Mean Absolute Percentage Error (SMAPE), as well as wavelet analysis, windowing calculation and other analysis methods.

Further, the integration operation when acquiring the virtual and real twin spaces S in step S4 includes weighted average, fuzzy theory, evidence theory, etc.

Further, in step S5, the method of using the deep learning network for fault diagnosis is: the total number of last output having a parameter layer of the deep network is replaced with (fault type n)×(fault location m)+1 (normal state), and network training is performed to classify and identify labels, thereby realizing identification and positioning of fault types.

Further, in step S6, in the later stage of diagnosis process and the continuous updating process of the diagnosis model constructed based on the virtual and real twin space, there are two ways to add the newly acquired data to the real physical space R for training set: when the data amount of newly added diagnosis sample is greater than the data mount of preset sample, and the process of training the twin diagnosis models from scratch takes longer than the preset time, it is advised to adopt the migration learning method, that is, perform the same feature extraction method on the new sample and return to step S5. The new sample data after feature extraction is utilized to perform migration learning on the originally trained diagnosis model, thereby updating the diagnosis model. Return to step S4 on conditions: the new sample is merged into the original $R_{train}$, thereby acquiring the training sample set in the twin spaces, and the training sample in the new twin spaces is utilized for retraining. If the data amount of newly added diagnosis sample is less than the data amount of preset sample, or the process of training from scratch takes shorter than the preset time, generally return to S4 to regenerate the twin spaces for training again.

Specifically, the data amount of preset sample and preset time can be determined depending on actual needs. The data amount of preset sample is adopted to reflect the newly added diagnosis data amount, and the preset time is adopted to reflect the speed of retraining.

In a embodiment of the disclosure, specific implementation steps are as follows.

Figure 2:
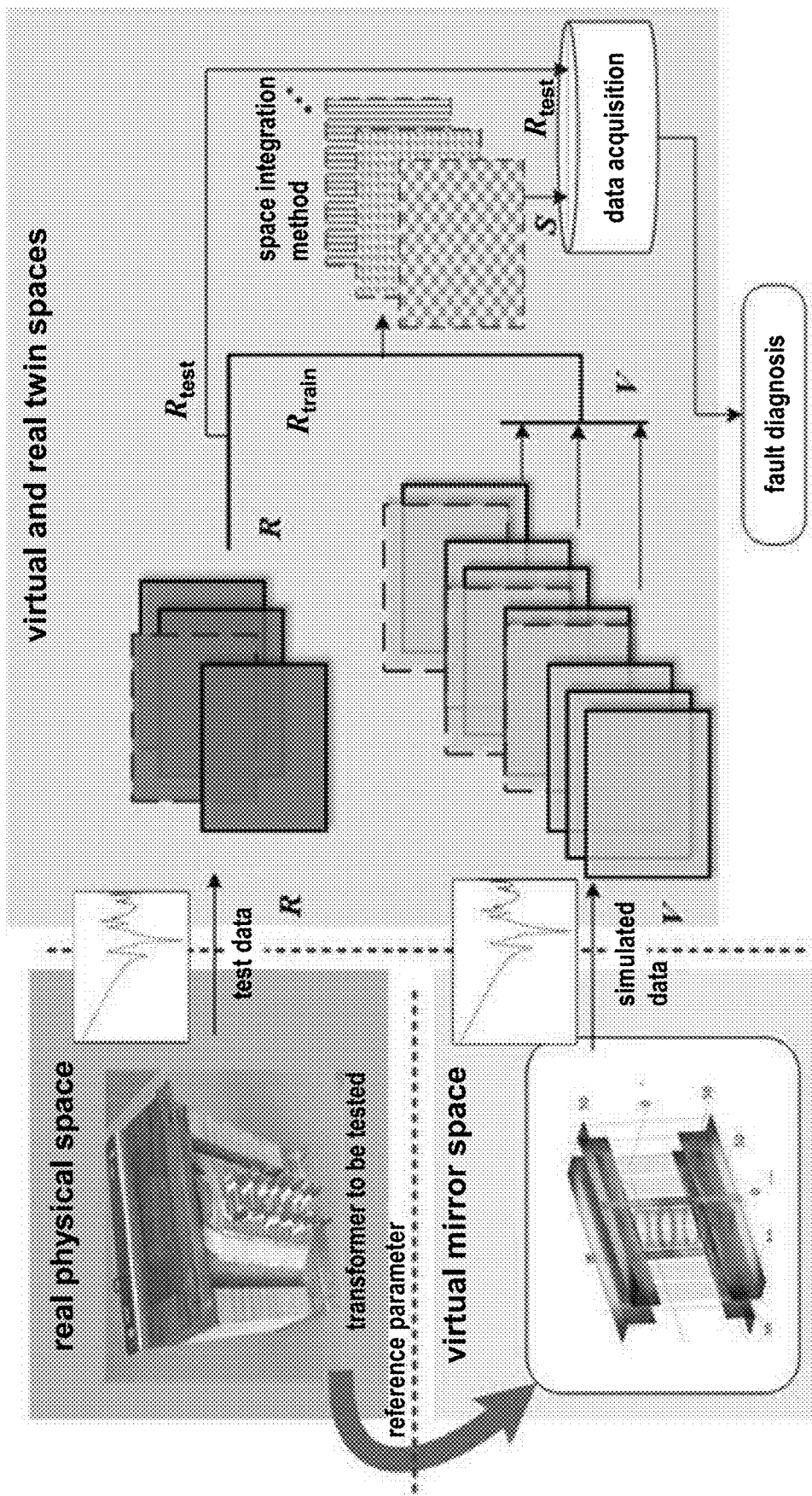
FIG. 2 is a schematic diagram of a diagnosing method in the virtual and real twin spaces according to an embodiment of the disclosure.
Figure 3:
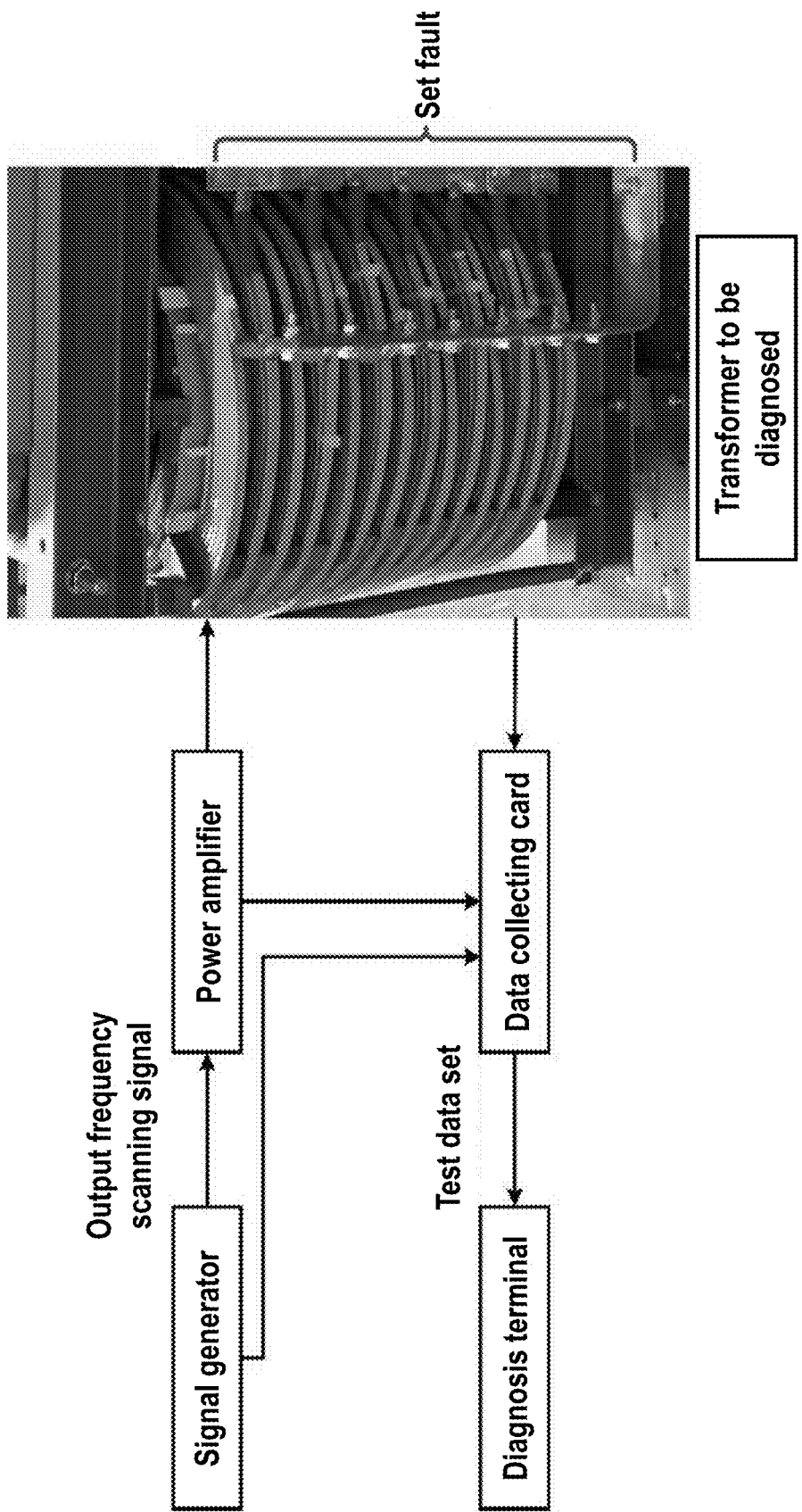
FIG. 3 is a schematic diagram of a method for acquiring a test data set according to an embodiment of the disclosure.

The schematic diagram of diagnosis method based on virtual and real twin spaces provided by the disclosure is as shown by FIG. 2. First of all, test samples containing different locations, types and severity levels of fault of power equipment are acquired according to step S1. FIG. 3 is a schematic diagram showing a frequency scanning response test being performed on the transformer to be diagnosed, the waveform of FRA being recorded, and fault test and setting. By connecting inductors in parallel and connecting capacitors in parallel through windings as well as adding pads between the windings, comparisons between different fault conditions can be made. If it is only required to determine whether there is a fault, the label is set as "Yes" and "No". If it is required to determine the types of fault and diagnose locations of fault, multiple labels need to be provided. For example: the fault type j and the fault area i are written together as 'ji' as the corresponding label γ, and the label indicating the normal state is written as '00', namely: γ={00, 11, 12, . . . , ji}. The test point of this embodiment is located at the end of the winding, that is, the output end. There are 3 fault types j (j=1, 2, 3) and 7 fault areas i (i=1, 2, . . . , 7), wherein the fault type j={1 (interval between pies), 2 (short circuit between pies), 3 (deformation)}. The fault area is divided by equally separating the transformer winding into 7 parts, and the input end to the output end of the frequency scanning signal are the $1^{st}$ to the $7^{th}$ parts respectively. For the fault of intervals between the pies of the winding (the winding consists of many turns wrapped as a pie, and many pies are combined into a complete coil), the simulation is carried out by connecting the capacitors in parallel between two pies of the winding. For the fault of short-circuit between the pies of the winding, the corresponding nuts are connected through the wire for comparison. For deformation fault of windings, simulation is carried out by connecting capacitors and inductors in parallel. Different fault levels are set for various types of fault, and frequency scanning response tests are preformed respectively to acquire the test samples, thereby forming the real physical space R.

Then, according to the structural parameters and material characteristics of the power transformer to be diagnosed, a 3D finite element model is established to calculate the grounding capacitance $C_g$, inter-winding capacitance $C_s$, self-inductance $L_s$, mutual inductance $M_{i(i+1)}$, resistance R, etc. Thereafter, the transfer function of transformer windings is established to substitute the circuit parameters obtained by simulation into the transfer function. By writing a program, for the fault type and fault area compared by the test data set and according to the labeled faults to be diagnosed in step S1, a loop is set is realize frequency scanning response analysis on the equivalent circuit with different fault levels/different fault locations/different fault types, thereby acquiring simulated data and combining the simulated data to form the virtual mirror space V.

The types and quantities of data obtained through step S1 and step S2 are shown in Table 1. There are a total of 880 sets of simulated data of transformer in the embodiment of the disclosure, and there are 220 sets of test sample data. For the virtual mirror space, all the simulated data sets will be used for the training of the diagnosis method. For the real physical space, 30% (3) of the test data sets will be used for algorithm training, and 70% (7) of the test data sets will be used to verify the effect; the data in the data sets is denoted as $R_{train}$ and $R_{test}$ respectively. The proportion of the test set and the training set can be set depending on the needs. It can be seen that the number of test data sets is extremely rare, and only 3 samples from each label are adopted for training in this embodiment.

TABLE 1

Quantity of test data sets and simulated data sets used for diagnosis

| label | simulated data sets | test data sets | simulated data sets with noise | total simulated sets | total experiment sets |
|---|---|---|---|---|---|
| 00 | 5 | 10 | 15 | 20 | 10 |
| 11/21/31 | 5/5/5 | 10/10/10 | 15/15/15 | 60 | 30 |
| 12/22/32 | 5/5/5 | 10/10/10 | 15/15/15 | 60 | 30 |
| 13/23/33 | 5/5/5 | 10/10/10 | 15/15/15 | 60 | 30 |
| 14/24/34 | 5/5/5 | 10/10/10 | 15/15/15 | 60 | 30 |
| 15/25/35 | 5/5/5 | 10/10/10 | 15/15/15 | 60 | 30 |
| 16/26/36 | 5/5/5 | 10/10/10 | 15/15/15 | 60 | 30 |
| 17/27/37 | 5/5/5 | 10/10/10 | 15/15/15 | 60 | 30 |
| Total | 110 | 220 | 330 | 440 | 220 |

Next, proceed to step S4, which is space hybridization and integration. The training set in the real physical space divided in step S3 and the sample set in the virtual mirror space acquired in step S2 are integrated spatially to acquire training sample set in the twin spaces. First, R-space is adopted to represent the real physical space, and V-space is adopted to represent the virtual mirror space. It is assumed that the power equipment status label corresponding to the data is γ, then γ={'00', '11', '12', . . . , '37'}. The samples with label γ in R-space are marked as $SR_\gamma=\{SR_{\gamma1}; SR_{\gamma2}; SR_{\gamma3}; \ldots\}$, which is referred to as a subset (sample clusters) of R-space; similarly, the sample clusters with label γ in V-space are marked as $SV_\gamma=\{SV_{\gamma1}; SV_{\gamma2}; SV_{\gamma3}; \ldots\}$. To be concise and clear, this embodiment omits the feature extraction step in step S4, and the FR curve is directly adopted for diagnosis. Moreover, a weight integration method is adopted to spatially integrate the training set in the real physical space acquired in step 3) with the sample set in the virtual mirror space, thereby obtaining the training sample set S in the virtual and real twin spaces.

The specific method is as follows: For each sample data in the R-space, the data of the equipment to be diagnosed with the same label (γ) is taken from the V-space, such as $SR_{γ1}$ and $SV_{γ2}$, and an integration operation is performed on them. Then, the sample set in the R-space and the sample set in the V-space are integrated with each other based on a random proportion. The symbol "⊗" represents the sample integration calculation. The calculation process is represented by the integration function φ(R, V), including: φ(R, V)=R⊗V. The calculation method of the weight integration method adopted in the embodiment of the disclosure is shown in the following formula:

$$S_γ = α(λ_{Rγ}) \cdot SR_γ + β(λ_{Vγ}) \cdot SV_γ$$

Specifically, $α(λ_{Rγ})$ and $β(λ_{Vγ})$ respectively represent the weight distribution matrix with the label γ in the R-space and V-space. In the embodiment of the disclosure, the setting value of the variable weight parameter is $ρ=\{α, β\}=\{(α_1, α_2, \ldots), (β_1, β_2, \ldots)\}$. Therefore, the parameter constraint equation P(ρ) is:

$$\sum_{1}^{λ_{Rγ}} α(λ_{Rγ}) + \sum_{1}^{λ_{Vγ}} β(λ_{Vγ}) = 1$$

After all the sample data in the R-space and V-space space are completed, the sample set S in the twin spaces is formed by the sample data altogether.

Figure 4:
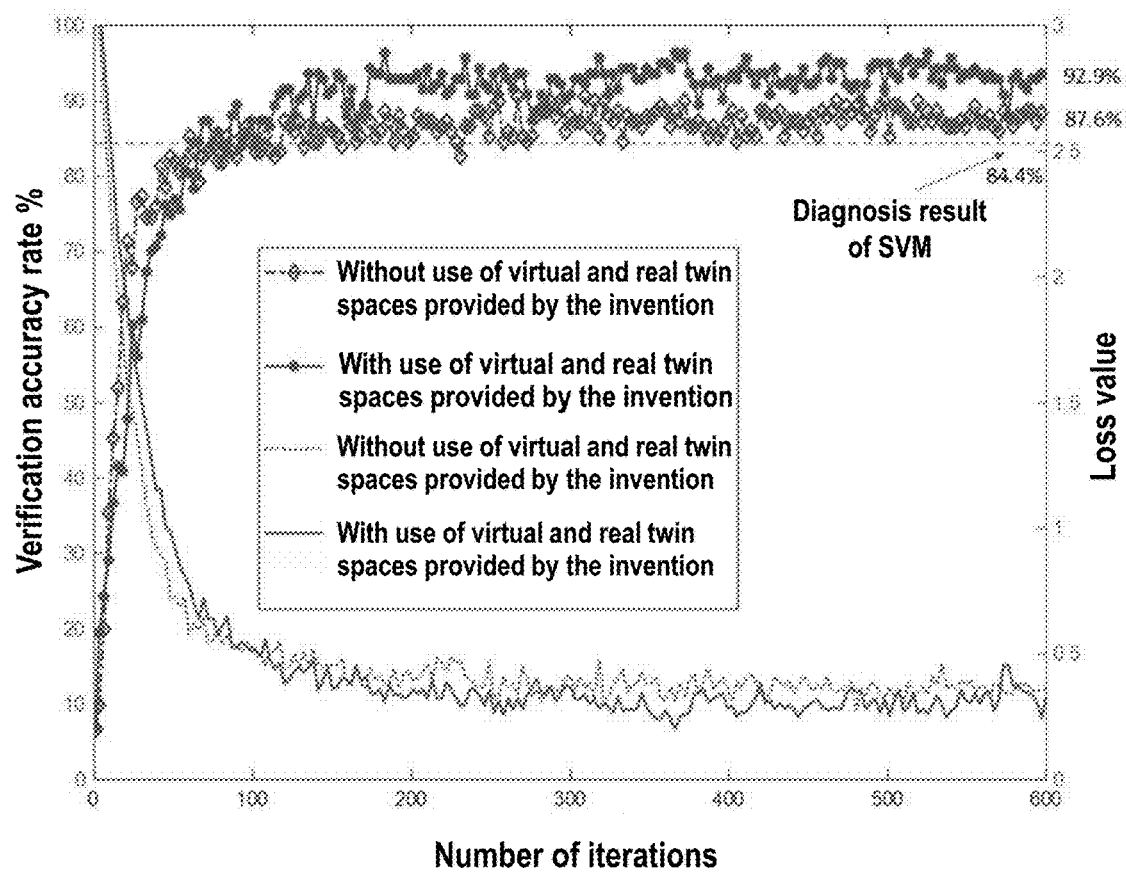
FIG. 4 is a comparison between a verification accuracy rate of diagnosis based on virtual and real twin spaces provided by an embodiment of the disclosure and a traditional method.

Next, based on step S5, the training sample set S in the twin spaces is adopted as a supplement to training set $R_{train}$ in the real physical space, and the fault type and fault location are adopted as diagnosis labels, which are input into the deep convolutional neural network for training. The verification set $R_{test}$ in the real physical space is subjected to fault identification and positioning to verify the diagnosis result. FIG. 4 shows the effect of the fault diagnosis method based on the virtual and real twin spaces in the disclosure, the effect based on the verification result of MobileNet-V2, the effect of directly adopted deep learning based on Mobile-Net-V2, and the effect of conventional method SVM. It can be seen that the diagnosis effect of the deep migration learning method based on MobileNet-V2 is better than that of SVM, and after considering the method based on virtual and real twin spaces provided in the disclosure, the accuracy of diagnosis is further improved compared to MobileNet-V2.

Finally, in the later stage of diagnosis process, the newly acquired data is added to the training set of the real physical space, and return to step S4 to continuously train and optimize the diagnosis network.

Figure 5:
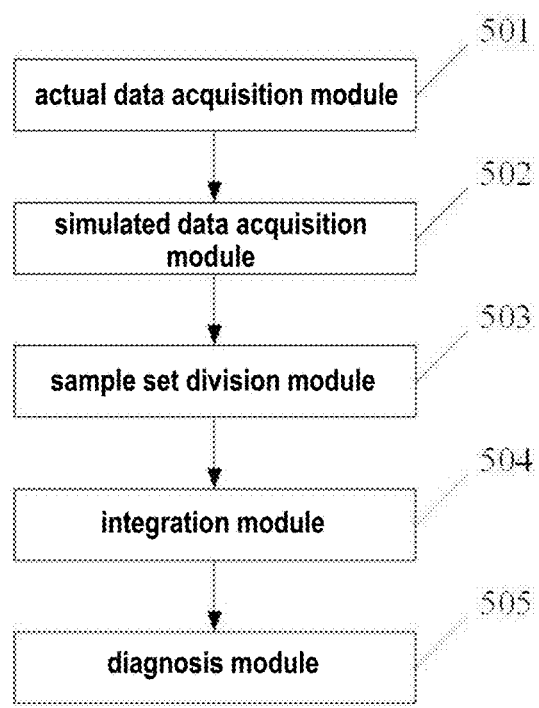
FIG. 5 is a schematic diagram of a system for fault diagnosis with small samples of power equipment based on virtual and real twin spaces according to an embodiment of the disclosure.

As shown in FIG. 5, in another embodiment of the disclosure, a system for fault diagnosis with small samples of power equipment based on virtual and real twin spaces is also provided, and the system includes:

A actual data acquisition module 501 is configured to acquire test samples containing different locations, types and severity levels of fault of power equipment to form a real physical space.

A simulated data acquisition module 502 is configured to establish a simulation model of the equipment to be diagnosed, and the corresponding fault type is configured, random noise is superimposed on the parameters of the simulation model to acquire a required number of samples by simulation to form a virtual mirror space.

A sample set division module 503 is configured to divide the samples in the real physical space into a training set and a verification set.

An integration module 504 is configured to spatially integrate the training set in the real physical space with the sample set in the virtual mirror space to obtain a training sample set in the virtual and real twin spaces.

A diagnosis module 505 is configured to use the training sample set in the virtual and real twin spaces as the supplement to the training set in the real physical space, and the fault type and fault location are used as diagnostic labels to be input to the deep neural network for training. The trained deep neural network is adopted to perform identification and positioning of fault on the verification set in the real physical space to verify the diagnosis result.

The specific implementation of various modules can be inferred from the description of the foregoing embodiment related to the method, and no repetition will be incorporated in the following description.

Another embodiment of the disclosure provides a computer-readable storage medium in which program instructions are stored. When the program instructions are executed by a processor, the method for fault diagnosis with small samples of power equipment based on virtual and real twin spaces is implemented.

It should be pointed out that depending on the needs of implementation, each step/component described in this disclosure can be split into more steps/components. Alternatively, two or more steps/components or part of steps/components can be operated and combined into new ones to achieve the purpose of the disclosure.

The above method in the disclosure can be implemented in hardware, firmware, or implemented as software or computer code that can be stored in a recording medium (such as CD ROM, RAM, floppy disk, hard disk, or magneto-optical disk), or implemented as computer code that can be downloaded through the Internet and is originally stored in the remote recording medium or non-transitory machine-readable medium and will be stored in the local recording medium. As such, the method described here can be processed by software that is stored in a general-purpose computer or a specific-purpose processor or programmable recording medium or recording medium for specific hardware (such as ASIC or FPGA). It can be understood that a computer, a processor, a microprocessor controller or a programmable hardware includes a storage element (for example, RAM, ROM, flash memory, etc.) that can store or receive software or computer code. When the software or the computer code is accessed and executed by a computer, processor, or hardware, the processing method described here is implemented. In addition, when a general-purpose computer accesses the code for implementing the processing shown here, the execution of the code converts the general-purpose computer into a specific-purpose computer for implementing the processing described here.

Those skilled in the art can easily understand that the above descriptions are only preferred embodiments of the present disclosure and are not intended to limit the present disclosure. Any modification, equivalent replacement and improvement, etc. made within the spirit and principle of the disclosure should fall within the protection scope of the present disclosure.

What is claimed is:

1. A method for fault diagnosis with small samples of a power equipment based on virtual and real twin spaces, comprising:

(1) acquiring test samples containing different locations, types and severity levels of fault of a power equipment to form a real physical space;

(2) establishing a simulation model of an equipment to be diagnosed, setting a corresponding fault type, and superimposing random noise on parameters of the simulation model to acquire a required number of samples by simulation to form a virtual mirror space;

(3) dividing samples in the real physical space into a training set and a verification set;

(4) integrating the training set in the real physical space spatially with the sample set in the virtual mirror space to obtain a training sample set in the virtual and real twin spaces;

(5) using the training sample set in the virtual and real twin spaces as a supplement to the training set in the real physical space, and using the fault type and fault location as diagnosis labels to be input to a deep neural network for training, and using the trained deep neural network to perform identification and positioning of fault on the verification set in the real physical space to verify a diagnosis result.

2. The method according to claim 1, wherein step (1) comprises:

areas are divided according to diagnosis requirements and fault characteristics of the equipment to be diagnosed, and the divided areas are used as different fault locations of the power equipment, the types and severity levels of fault are determined according to the regularity of statistical data of fault of the equipment to be diagnosed, test samples containing different locations, types and severity levels of fault of power equipment are obtained to form the real physical space.

3. The method according to claim 2, wherein step (2) comprises:

in the simulation model of the equipment to be diagnosed, the simulated fault type and fault location are configured according to the actual fault type and fault location divided in step (1), and the severity level in simulation is randomly set according to a distribution of an actual fault level;

a loop simulation is performed to involve different fault areas, fault types and fault levels, so as to obtain simulated fault samples of the equipment, and the virtual mirror space is formed through the fault samples obtained from all simulations.

4. The method according to claim 1, wherein step (4) comprises:

a power equipment status label corresponding to the data is set as $\gamma$, and the sample with label $\gamma$ in the real physical space is marked as $SR_\gamma=\{SR_{\gamma1}; SR_{\gamma2}; SR_{\gamma3}; \ldots\}$, which is called a subset of the real physical space, the subset of the real physical space contains a total of $NR_\gamma$ samples, and $NR_\gamma$ represents a data amount of samples with the label $\gamma$ in the real physical space;

the samples with the label $\gamma$ in the virtual mirror space are denoted as $SV\gamma=\{SV\gamma1; SV\gamma2; SV\gamma3; \ldots\}$, which is called a subset of the virtual mirror space, and the subset of the virtual mirror space contains $NV\gamma$ samples in total, and $NV\gamma$ represents the number of samples with the label $\gamma$ in the virtual mirror space;

fault feature extraction is performed on all samples in the subset in the real physical space and the subset in the virtual mirror space, and the original sample data is replaced with the sample data after feature extraction;

a sample data of the first equipment to be diagnosed with the label $\gamma$ is taken from the subset in the real physical space, and a sample data of the second equipment to be diagnosed with the label $\gamma$ is taken from the subset in the virtual mirror space, the sample data of the first equipment to be diagnosed and the sample data of the second equipment to be diagnosed are integrated, so as to complete integration of various samples in the subset in the real physical space and various samples in the subset in the virtual mirror space to obtain a training sample set in the virtual and real twin spaces.

5. The method according to claim 2, wherein step (4) comprises:

a power equipment status label corresponding to the data is set as $\gamma$, and the sample with label $\gamma$ in the real physical space is marked as $SR_\gamma=\{SR_{\gamma1}; SR_{\gamma2}; SR_{\gamma3}; \ldots\}$, which is called a subset of the real physical space, the subset of the real physical space contains a total of $NR_\gamma$ samples, and $NR_\gamma$ represents a data amount of samples with the label $\gamma$ in the real physical space;

the samples with the label $\gamma$ in the virtual mirror space are denoted as $SV\gamma=\{SV\gamma1; SV\gamma2; SV\gamma3; \ldots\}$, which is called a subset of the virtual mirror space, and the subset of the virtual mirror space contains $NV\gamma$ samples in total, and $NV\gamma$ represents the number of samples with the label $\gamma$ in the virtual mirror space;

fault feature extraction is performed on all samples in the subset in the real physical space and the subset in the virtual mirror space, and the original sample data is replaced with the sample data after feature extraction;

a sample data of the first equipment to be diagnosed with the label $\gamma$ is taken from the subset in the real physical space, and a sample data of the second equipment to be diagnosed with the label $\gamma$ is taken from the subset in the virtual mirror space, the sample data of the first equipment to be diagnosed and the sample data of the second equipment to be diagnosed are integrated, so as to complete integration of various samples in the subset in the real physical space and various samples in the subset in the virtual mirror space to obtain a training sample set in the virtual and real twin spaces.

6. The method according to claim 3, wherein step (4) comprises:

a power equipment status label corresponding to the data is set as $\gamma$, and the sample with label $\gamma$ in the real physical space is marked as $SR_\gamma=\{SR_{\gamma1}; SR_{\gamma2}; SR_{\gamma3}; \ldots\}$, which is called a subset of the real physical space, the subset of the real physical space contains a total of $NR_\gamma$ samples, and $NR_\gamma$ represents a data amount of samples with the label $\gamma$ in the real physical space;

the samples with the label $\gamma$ in the virtual mirror space are denoted as $SV\gamma=\{SV\gamma1; SV\gamma2; SV\gamma3; \ldots\}$, which is called a subset of the virtual mirror space, and the subset of the virtual mirror space contains $NV\gamma$ samples in total, and $NV\gamma$ represents the number of samples with the label $\gamma$ in the virtual mirror space;

fault feature extraction is performed on all samples in the subset in the real physical space and the subset in the virtual mirror space, and the original sample data is replaced with the sample data after feature extraction;

a sample data of the first equipment to be diagnosed with the label $\gamma$ is taken from the subset in the real physical space, and a sample data of the second equipment to be diagnosed with the label $\gamma$ is taken from the subset in the virtual mirror space, the sample data of the first equipment to be diagnosed and the sample data of the second equipment to be diagnosed are integrated, so as to complete integration of various samples in the subset in the real physical space and various samples in the subset in the virtual mirror space to obtain a training sample set in the virtual and real twin spaces.

7. The method according to claim 4, wherein the sample integration is performed through φ(R, V)=R⊗V, wherein φ(R, V) represents an integration function, R represents the sample in a subset in the real physical space, and V represents the sample in the subset in the virtual mirror space.

8. The method according to claim 1, wherein the method of using the deep neural network for fault diagnosis in step (5) is:
a total number of last outputs with a parameter layer in the deep neural network is replaced with n×m+1, so as to perform network training to classify and identify the fault labels, and realize identification and positioning of the fault type, wherein n is the fault type and m is the fault location.

9. The method according to claim 1, wherein the method further comprises:
adding the new data to be diagnosed into the training set in the real physical space, returning to step S4, and updating the network continuously.

10. The method according to claim 7, wherein when an amount of new data to be diagnosed is greater than an amount of preset sample data, and the training from scratch takes longer than a preset time, feature extraction is performed on the new data to be diagnosed, and the new sample data after feature extraction is utilized to perform migration learning on the originally trained network, thereby updating the network; alternatively, the new data to be diagnosed is merged into the original training set in the real physical space to reacquire the training sample set in the virtual and real twin spaces, and the new training sample set in the virtual and real twin spaces is utilized for retraining;
when the amount of new data to be diagnosed is less than the amount of preset sample data, or the training from scratch takes shorter than the preset time, the new data to be diagnosed is merged into the original training set in the real physical space, thereby reacquiring the training sample set in the virtual and real twin spaces, and the new training sample set in the virtual and real twin spaces is utilized for retraining.

11. A system for fault diagnosis with small samples of a power equipment based on virtual and real twin spaces, comprising:
a processor, configured to:
acquire test samples containing different locations, types and severity levels of fault of power equipment to form a real physical space;
establish a simulation model of the equipment to be diagnosed, and a corresponding fault type is configured, and random noise is superimposed on parameters of the simulation model to obtain a required number of samples by simulation to form a virtual mirror space;
divide the samples in the real physical space into a training set and a verification set;
integrate a training set in the real physical space with a sample set in the virtual mirror space to obtain a training sample set in the virtual and real twin spaces; and
utilize the training sample set in the virtual and real twin spaces as a supplement to the training set in the real physical space, and the fault type and the fault location are used as diagnostic labels to be input to a deep neural network for training, and the trained deep neural network is utilized to perform identification and positioning of fault on a verification set in the real physical space to verify a diagnosis result.

12. The method according to claim 1, wherein the method is to be executed by a computer comprising a processor and a non-transitory storage medium according to program instructions which are stored in the non-transitory computer-readable storage medium and to be loaded into the processor to configure the processor to execute steps of claim 1.

13. The method according to claim 2, wherein the method is to be executed by a computer comprising a processor and a non-transitory storage medium according to program instructions which are stored in the non-transitory computer-readable storage medium and to be loaded into the processor to configure the processor to execute steps of claim 2.

14. The method according to claim 3, wherein the method is to be executed by a computer comprising a processor and a non-transitory storage medium according to program instructions which are stored in the non-transitory computer-readable storage medium and to be loaded into the processor to configure the processor to execute steps of claim 3.

15. The method according to claim 4, wherein the method is to be executed by a computer comprising a processor and a non-transitory storage medium according to program instructions which are stored in the non-transitory computer-readable storage medium and to be loaded into the processor to configure the processor to execute steps of claim 4.

16. The method according to claim 5, wherein the method is to be executed by a computer comprising a processor and a non-transitory storage medium according to program instructions which are stored in the non-transitory computer-readable storage medium and to be loaded into the processor to configure the processor to execute steps of claim 5.

17. The method according to claim 6, wherein the method is to be executed by a computer comprising a processor and a non-transitory storage medium according to program instructions which are stored in the non-transitory computer-readable storage medium and to be loaded into the processor to configure the processor to execute steps of claim 6.

18. The method according to claim 7, wherein the method is to be executed by a computer comprising a processor and a non-transitory storage medium according to program instructions which are stored in the non-transitory computer-readable storage medium and to be loaded into the processor to configure the processor to execute steps of claim 7.

19. The method according to claim 8, wherein the method is to be executed by a computer comprising a processor and a non-transitory storage medium according to program instructions which are stored in the non-transitory computer-readable storage medium and to be loaded into the processor to configure the processor to execute steps of claim 8.

20. The method according to claim 9, wherein the method is to be executed by a computer comprising a processor and a non-transitory storage medium according to program instructions which are stored in the non-transitory computer-readable storage medium and to be loaded into the processor to configure the processor to execute steps of claim 9.

* * * * *